United States Patent [19]

Matsushita et al.

[11] Patent Number: 4,948,695
[45] Date of Patent: Aug. 14, 1990

[54] PHOTOSENSITIVE HEAT-TRANSFER RECORDING SHEET AND PHOTOSENSITIVE PRESSURE-SENSITIVE RECORDING SHEET

[75] Inventors: Toshihiko Matsushita; Shigetoshi Hiraishi, both of Tokyo; Sadao Morishita, Ushiku, all of Japan

[73] Assignee: Mitsubishi Paper Mills, Ltd., Tokyo, Japan

[21] Appl. No.: 357,614

[22] Filed: May 25, 1989

Related U.S. Application Data

[63] Continuation of Ser. No. 253,326, Oct. 3, 1988, abandoned, which is a continuation of Ser. No. 895,810, Aug. 12, 1986, abandoned.

[30] Foreign Application Priority Data

Aug. 14, 1985 [JP] Japan ................................ 60-179596
Aug. 14, 1985 [JP] Japan ................................ 60-179597

[51] Int. Cl.$^5$ ........................... G03K 1/68; G03K 1/72
[52] U.S. Cl. ................................. 430/138; 430/199; 430/200; 430/913; 427/150; 428/402.2; 428/402.21; 428/402.24
[58] Field of Search ............... 430/138, 199, 200, 254, 430/913; 428/402.2, 402.21, 402.24; 427/150

[56] References Cited

U.S. PATENT DOCUMENTS

| | | | |
|---|---|---|---|
| 3,219,446 | 11/1965 | Berman | 430/199 |
| 3,721,557 | 3/1972 | Inoue | 96/28 |
| 4,352,855 | 10/1982 | Hiraishi et al. | 427/151 |
| 4,435,471 | 3/1984 | Matsushita et al. | 364/211 |
| 4,489,151 | 12/1984 | Sanders et al. | 430/138 |
| 4,491,627 | 1/1985 | Iijima et al. | 430/138 |
| 4,500,624 | 2/1985 | Aono et al. | 430/138 |
| 4,501,809 | 2/1985 | Hiraishi et al. | |
| 4,536,463 | 8/1985 | Sanders | 430/138 |
| 4,551,407 | 11/1985 | Sanders et al. | 430/138 |
| 4,562,137 | 12/1985 | Sanders | 430/138 |
| 4,576,891 | 3/1986 | Adair et al. | 430/138 |

FOREIGN PATENT DOCUMENTS

| | | |
|---|---|---|
| 121790 | 11/1981 | Japan . |
| 57-187296 | 3/1982 | Japan . |
| 182488 | 4/1982 | Japan . |
| 182489 | 5/1982 | Japan . |
| 182490 | 9/1982 | Japan . |
| 207088 | 9/1982 | Japan . |
| 136291 | 8/1984 | Japan . |

Primary Examiner—Paul R. Michl
Assistant Examiner—Patrick A. Doody
Attorney, Agent, or Firm—Cushman, Darby & Cushman

[57] ABSTRACT

This invention relates to a photosensitive heat-transfer recording sheet and a photosensitive pressure-sensitive recording sheet both using photocurable microcapsules. These sheets enable transfer of multi-color images onto plain papers and accordingly have a very important industrial significance under the present situation where duplicate recording of color images is required.

11 Claims, No Drawings

PHOTOSENSITIVE HEAT-TRANSFER RECORDING SHEET AND PHOTOSENSITIVE PRESSURE-SENSITIVE RECORDING SHEET

This is a continuation of application Ser. No. 253,326, filed Oct. 3, 1988, now abandoned, which is a continuation of Ser. No. 895,810, filed Aug. 12, 1986, which was abandoned.

FIELD OF THE INVENTION

This invention relates to a photosensitive heat-transfer recording sheet and a photosensitive pressure-sensitive recording sheet both enabling image transfer onto plain papers.

PRIOR ART

As mentioned above, the present invention relates to a heat-transfer recording sheet as well as to a pressure-sensitive recording sheet. Hence, respective prior arts will be described below separately.

(i) Prior Art For Heat-Transfer Recording Sheets

In rivalry with the conventional heat-sensitive recording using a thermal recording apparatus such as a thermal printer, a thermal facsimile or the like, heat-transfer recording, because of its advantages such as retainability, indelibility and solvent resistance of recorded images, is gradually being put into practical application. This heat-transfer recording uses a recording sheet called "a heat-transfer recording sheet", comprising a support and a heat-meltable ink layer formed thereon; the heat-transfer recording sheet is placed on a plain paper so that the ink layer of the recording sheet faces the plain paper; and recording is conducted to them with a thermal head such as a thermal facsimile, whereby an image is transferred from the heat-transfer recording sheet to the plain paper by the heat transmitted from the thermal head.

Heat-transfer recording in a single color (e.g. a black color) is already put into practical application. Researches on heat-transfer recording have shifted from those for single color to those for multi-color, as appreciated from various Japanese Patent Publications.

For example, Japanese patent application Kokai (Laid-Open) No. 182488/1982 discloses a heat-transfer recording sheet comprising a base sheet and heat-transfer ink layers formed thereon [these ink layer consist of three primary color ink layers (red, blue and yellow ink layers) and a black ink layer].

Japanese Patent Application Kokai (Laid-Open) No. 182489/1982 discloses a heat-transfer recording sheet comprising (a) a base sheet and (b) a plurality of ink layers each of different color and formed on the base sheet, wherein the area of each ink layer is determined so as to be in proportion to its use frequency.

Further, Japanese Patent Application Kokai (Laid-Open) No. 162490/1982 discloses a heat-transfer recording sheet comprising (a) a base sheet and (b) a plurality of ink layers formed on the base sheet, each of the ink layers having a different color and being arranged along the secondary scanning direction.

The heat-transfer recording sheets exemplified above have drawbacks in that they not only incur the complication of the recording apparatus used, particularly, the recording system and the transfer and driving system but also are difficult to meet increasingly high recording speed.

As an improvement over the heat-transfer recording sheets exemplified above, Japanese patent application Kokai (Laid-Open) No. 187296/1982 discloses a heat-transfer recording sheet comprising (a) a base sheet and (b) a transfer layer formed on the main side of the base sheet and containing at least three kinds of microcapsules, each kind of microcapsules enclosing a different color substance having a different color (one of three primary colors, namely, red, blue and yellow colors), and each kind of microcapsules having a different melting point. It is described therein that with this recording sheet, a multi-color transferred image can be obtained simply by heating the thermal head at temperatures corresponding to the melting points of the respective microcapsules and that the simplification of the recording apparatus is expectable.

The above recording sheet has a drawback in that the wall membranes of the microcapsules enclosing a heat-meltable ink can hardly be destroyed even when a high voltage is applied and accordingly the transferred image has a poor quality.

As an improvement over the heat-transfer recording sheets disclosed in the above mentioned patent publications, Japanese Patent Application Kokai (Laid-Open) No. 136291/1984 invented by the present inventors and filed by the present applicant discloses a multi-color heat-transfer recording sheet comprising (a) a support and (b) a layer formed thereon and containing three kinds of microcapsules, each kind of microcapsules enclosing a different heat-meltable ink having a different color (one of three primary colors of magenta, cyan and yellow). With this recording sheet, a multi-color transferred image can be obtained simply by destroying the microcapsules beforehand and heating the thermal head at temperatures corresponding to the melting points of the heat-meltable inks. The recording sheet is intended to provide a multi-color transferred image of dot type on a plain paper, by mixing three kinds of microcapsules [each kind of microcapsules enclose a different heat-meltable ink having a different color (one of three primary colors)] and coating the mixture on a support in a single layer. The recording sheet, however, has drawbacks in that it must be pressurized prior to image transfer and this pressurization process makes difficult the handling of said recording sheet when a very thin support is used therein.

(ii) Prior Art for Pressure-Sensitive Recording Sheets

As the conventionally known pressure-sensitive recording sheets enabling image transfer onto a plain paper, there are transfer-onto-plain-paper type pressure-sensitive recording sheets as disclosed in Japanese patent application Kokai (Laid-Open) Nos. 121790/1981 and 207088/1982.

The transfer-onto-plain-paper type pressure-sensitive sheet disclosed in Japanese patent application Kokai (Laid-Open) No. 121790/1981 comprises (a) a support and (b) a mixture layer coated on one side of the support and consisting of an electron-donating color former, an electron-accepting color developer, a wax, etc. and is characterized by using, as the wax, two kinds of waxes, an amide type wax and other type wax.

The transfer-onto-plain-paper type pressure-sensitive recording sheet disclosed in Japanese patent application Kokai (Laid-Open) No.:207088/1982 comprises (a) a support and (b) a layer formed on the back side of the support and containing a ligand, a metal compound and a wax.

These transfer-onto-plain-paper type pressure-sensitive recording sheets have good image transferability toward plain papers and optionally enable copying by coating the back side of the support wholly or partially.

With these recording sheets, however, image transfer onto a plain paper is conducted only in a single color. More particularly, only one color former is coated on a support. Even if a plurality of different color formers are coated, the transferred image has only one mixed color.

Meanwhile, there is a pressure-sensitive recording sheet enabling image transfer using a color dye, disclosed in USP No. 3219446. According to this invention, a color dye and a polymerizable monomer are mixed and encapsulated; the resulting microcapsules are coated on a base sheet to form a transfer layer; the coated base sheet is combined with a receiving sheet; and only the necessary portions of the transfer layer are transferred onto the receiving sheet and the unnecessary portions are exposed to ultraviolet rays to convert the microcapsules in the unnecessary portions to rigid microcapsules, whereby the transfer of the transfer layer is controlled. However, the specification of the above invention mentions only of image transfer in a single color.

The object of the present invention resides in providing (1) a novel heat-transfer recording sheet where the above mentioned drawbacks of the conventional heat-transfer recording sheets are improved and (2) a novel pressure-sensitive recording sheet where the above mentioned drawbacks of the conventional pressure-sensitive recording sheets are improved.

SUMMARY OF THE INVENTION

The object of the present invention mentioned above has been attained by developing:

(A) a photosensitive heat-transfer recording sheet comprising (a) a support and (b) a layer formed thereon and containing at least one kind of microcapsules, the wall material of which consists of a heat-meltable substance, the microcapsules enclosing a photocurable resin solution in which a pigment or dye and a photopolymerization initiator are dissolved or dispersed, and (B) a photosensitive pressure-sensitive recording sheet comprising (a) a support and (b) a layer formed thereon and containing at least three kinds of microcapsules, each kind of microcapsules enclosing a photocurable resin solution in which a pigment or dye and a photopolymerization initiator are dissolved or dispersed, the pigment or dye being yellow, magenta and cyan and each pigment or dye being enclosed in a different kind of microcapsules, and the microcapsules-containing layer further containing a wax.

DETAILED DESCRIPTION OF THE INVENTION

As mentioned above, the present invention relates to a photosensitive heat-transfer recording sheet (A) and a photosensitive pressure-sensitive recording sheet (B). Respective preferred embodiments will be explained separately.

PHOTOSENSITIVE HEAT-TRANSFER RECORDING SHEET (A)

The recording sheet (A) of the present invention has a first essential requirement that the recording sheet (A) comprises (a) a support and (b) a layer formed thereon and containing at least one kind of microcapsules, the wall material of which consists of a heat-meltable substance.

As the heat-meltable substance constituting the wall material of the microcapsules, there can be mentioned waxes.

These waxes include animal waxes such as bees wax, spermaceti, Chinese wax, lanolin and the like; vegetable waxes such as candelilla wax, carnauba wax, Japan wax, rice wax, cane wax and the like; mineral waxes such as montan wax, ozokerite, ceresine, lignite wax and the like; petroleum waxes such as paraffin wax, micro-crystalline wax and the like; modified waxes such as a montan wax derivative, a paraffin wax derivative, a microcrystalline wax derivative and the like; hydrogenated waxes such as castor wax, opal wax and the like; synthetic waxes such a low molecular polyethylene and its derivative, acra wax, distearyl ketone and the like; saturated fatty acid amide type waxes such as caproic acid amide, caprylic acid amide, pelargonic acid amide, capric acid amide, lauric acid amide, tridecylic acid amide, myristic acid amide, stearic acid amide, behenic acid amide, ethylenebisstearic acid amide and the like; and unsaturated fatty acid amide type waxes such as caproleic acid amide, myristoleic acid amide, oleic acid amide, elaidic acid amide, linolic acid, eruic acid amide, ricinoleic acid amide, linolenic acid amide and the like. These waxes can be used singly or in combination.

As the heat-meltable substance, there can also be mentioned gum arabic, a starch, a polyvinyl acetate, an ethylene-vinyl acetate copolymer, a polyvinyl alcohol, a polyethylene, a polystyrene, a polyamide, a polyester, a polyurethane, a polyethylene-imine, etc. Heat-meltable substances capable of well transmitting a light, particularly ultraviolet rays are preferred.

The microcapsules used in the recording sheet (A) can be produced according to a method known in the industry. The method includes, for example, a method by phase separation from an aqueous solution as disclosed in USP Nos. 2,800,457 and 2,800,458, etc., an interfacial polymerization method as disclosed in Japanese Patent Publication Nos. 19574/1963, 446/1967 and 771/1967, etc., an in-situ method by monomer polymerization as disclosed in Japanese Patent Publication No. 9168/1961, Japanese patent application Kokai (Laid-Open) No. 9079/1976, etc., a melting-dispersion-cooling method as disclosed in UK Pat. Nos. 952807 and 965074, etc. and a spray-drying method as disclosed in USP No. 3,111,407, UK Pat. No. 30422, etc. Of course, other methods can be used.

As the support on which a microcapsules-containing layer is formed, there can freely be selected a transparent, semi-transparent or non-transparent support. There can be used, for example, papers, various nonwoven cloths, synthetic papers, metal foils, plastic films and composite sheets obtained by combining them.

In order to coat a solution containing said microcapsules on said support to form a microcapsules-containing layer thereon, the whole surface of the support is coated using, for example, an air knife coater, a blade coater, a gravure coater or the like, or the part of the support is coated using a flexographic printer, a gravure printer or the like.

The recording sheet (A) of the present invention has a second essential requirement that the microcapsules enclose a photocurable resin solution in which a pigment or dye and a photopolymerization initiator are dissolved or dispersed.

The pigment or dye to be enclosed in the microcapsules can be a single substance when recording in a single color is aimed. When a full-color transferred image need be obtained, however, the pigment or dye are yellow, magenta and cyan substances and each of them is enclosed in a different kind of microcapsules. Hence in this case, at least three kinds of microcapsules are required.

As the pigment or dye, there can be mentioned the following.

As white pigments, there can be mentioned zinc white, white lead, basic lead sulfate, lead sulfate, lithopone, zinc sulfide, titanium oxide and antimony oxide; as black pigments, there can be mentioned carbon black, acetylene black, lamp black, bone black, graphite, iron black, mineral black, aniline black and cyanine black; as yellow pigments, there can be mentioned chrome yellow, zinc yellow, barium chromate, cadmium yellow, yellow iron oxide, ochre, Titan Yellow, lead cyanamide, calcium plumbate, Naphthaol Yellow S, Hansa Yellow 10G, Hansa Yellow 5G, Hansa Yellow 3G, Hansa Yellow G, Hansa Yellow GR, Hansa Yellow A, Hansa Yellow RN, Hansa Yellow R, Pigment Yellow L, Benzidine Yellow, Benzidine Yellow G, Benzidine Yellow GR, Permanent Yellow NCG, Vulcan Fast Yellow 5G, Vulcan Fast Yellow R, Tartrazine Lake, Quinoline Yellow Lake, Anthragen Yellow 6GL, Permanent Yellow FGL, Permanent Yellow H10G, permanent Yellow HR, and Anthrapyrimidine Yellow; as orange pigments, there can be mentioned chrome orange, Chrome Vermilion, Sudan I, Permanent Orange, Lithol Fast Orange, Permanent Orange GTR, Hansa Yellow 3R, Vulcan Fast Orange GG, Benzidine Orange G, Persian Orange, Indanthrene Brilliant Orange GK, Indanthrene Brilliant Orange RK and Indanthrene Brilliant Orange; as brown pigment, there can be mentioned iron oxide, amber, Permanent Brown and Para Brown; as red pigments, there can be mentioned red iron oxide, red lead, silver vermilion, cadmium red, cadmium mercury red, antimony red, Permanent Red 4R, Para Red, Fire Red, p-chloro-o-nitroaniline red, Lithol Fast Scarlet G, Brilliant Fast Scarlet, Western vermilion, Brilliant Carmine BS, Permanent Red F2R, Permanent Red F4R, Permanent Red FRL, Permanent Red FRLL, Permanent Red F4RH, Fast Scarlet VD, Vulcan Fast Rubin B, Vulcan Fast Pink G, Light Fast Red Toner B, Light Fast Red Toner R, Permanent Carmine FB, Pyrazolone Red, Lithol Red, Lake Red C, Lake Red D, Anthocin B, Brilliant Scarlet G, Lithol Rubin GK, Permanent Red F5R, Brilliant Carmine 6B, Pigment Scarlet 3B, Bordeaux 5B, Toluidine Maroon, Permanent Bordeaux F2R, Helio Bordeaux BL, Bordeaux 10B, BON Maroon Light, BON Maroon Medium, eosin lake, Phodamine Lake, Rhodamine Lake Y, Alizarine Lake, Thioindigo red B, Thioindigo maroon, Permanent Red FGR, PV Carmine HR, Monolight Fast Red YS and Permanent Red BL; as violet pigments, there can be mentioned cobalt violet, manganese violet, Fast Violet B, Methyl Violet Lake and oxazine violet; as blue pigments, there can be mentioned ultramarine, prussian blue, cobalt blue, cerulean blue, asbolite, Alkali Blue Lake, Peacock Blue Lake, Pico Blue Lake, Victoria Blue Lake, metal-free Phthalocyanine Blue, Phthalocyanine Blue, Fast Sky Blue, Indanthrene Blue RS, Indanthrene Blue BC and indigo; and as green pigments, there can be mentioned chrome green, zinc green, chromium oxide, virdian, emerald green, cobalt green, Pigment Green B, Naphthaol Green B, green gold, Acid Green Lake, Malachite Green Lake, Phthalocyanine Green and polychlorobromocuprophthalocyanine.

As color dyes, there can be mentioned those of, for example, monoazo type, diazo type, metal complex monoazo type, anthraquinone type, phthalocyanine type and triarylmethane type. When they are specifically expressed using color index numbers, there can be mentioned, as yellow dyes, 11020, 11021, 12055, 12700, 18690, 18820, 4700, etc.; as red dyes, there can be mentioned 12010, 12150, 12715, 26105, 26125, 27291, 45170B, 60505, etc.; as green dyes, there can be mentioned 61565, etc.; as blue dyes, there can be mentioned 61100, 61705, 61525, 62100, 42563B, 74350, etc.; and as black dyes, there can be mentioned 12195, 26150, 50415, etc.

As the photocurable resin to be enclosed in the microcapsules, there can freely be used photodimerizable resins having a photosensitive group such as cinnamic acid residue, cinnamylidene residue, $\alpha,\beta$-unsaturated ketone residue, coumarin residue, anthracene residue, $\alpha$-phenylmaleimide residue, benzophenone residue, stilbene residue or the like; photodecomposable resins having a photosensitive group such as diazonium salt residue, quinonediazide residue, azide residue, dithiocarbamate residue, benzoin residue or the like; photopolymerizable resins having a group such as acryloyl group, allyl group, vinyl group, epoxy group or the like; and so forth. The photopolymerizable resins are preferred. Resins of liquid form can be used advantageously.

As the photopolymerization initiator functioning to polymerize the photocurable resin, there can be used known compounds ordinarily used such as a benzoin alkyl ether, benzophenone, a Michler's ketone, a thioxanthone or its derivative, an acetophenone or its derivative and the like. In order to broaden the wavelength range to which the photopolymerization initiator used is sensitive, there can also be used, together with the photopolymerization initiator, a photosensitizer such as anthraquinone, 5-nitrofluorene or the like.

When the pigment or dye is yellow, magenta and cyan and each pigment or dye is enclosed in a different kind of microcapsules, it is preferable that the photopolymerization initiator enclosed in the micro-capsules enclosing an yellow pigment or dye have a $\lambda$max of 340 nm, that the photopolymerization initiator enclosed in the microcapsules enclosing a magenta pigment or dye have a $\lambda$max of 300 nm and that the photopolymerization initiator enclosed in the microcapsules enclosing a cyan pigment or dye have a $\lambda$max of 250 nm.

The microcapsules can further enclose an organic solvent in order for the pigment or dye to be sufficiently dissolved in the photocurable resin. As such an organic solvent, there can be mentioned alkylnaphthalenes, alkylbiphenyls, alkylidenebiphenyls, esters, etc. However, the use of the organic solvent in a large amount is not appropriate because it adversely affects the curing of the photocurable resin.

In order to enhance the storability of the microcapsules, the microcapsules can furthermore enclose, as necessary, a stabilizer (e.g. a radical polymerization inhibitor), a modifier, a diluent (e.g. an oligomer or monomer of relatively small molecular weight), etc.

In the microcapsules-containing layer (the photosensitive heat-transfer layer) of the photosensitive heat-transfer recording sheet (A) of the present invention, there is used a binder and/or a latex in order to allow the layer to adhere to the support. As the binder and/or the latex, there can be mentioned, for example, water-soluble or oil-soluble high molecular substances such as gelatin, casin, carboxymethyl cellulose, hydroxymethyl cellulose, an oxidized starch, an esterified starch, a polyvinyl alcohol, a polyvinyl pyrrolidone, a polyacrylic acid, a vinyl acetate-acrylic acid copolymer, an acrylonitrile-butadiene copolymer, a vinylidene chloride type copolymer and the like, as well as latices. These substances are selected from the standpoints of required film surface strength, required dispersibility, etc. and are used single or in combination.

In the microcapsules-containing layer (the photosensitive heat-transfer layer), there can further be used a capsule-protecting agent (e.g. cellulose powder, starch powder, resin powder), an inorganic pigment (e.g. talc, calcium carbonate, zinc oxide, titanium oxide), an organic pigment (e.g. an urea-formalin resin), a dispersing agent, a defoamant, etc.

According to a preferred embodiment of the photosensitive heat-transfer recording sheet (A) of the present invention, plural kinds of microcapsules (each kind of microcapsules enclose a different pigment or dye) are coated on a support in a single layer. Therefore, the recording sheet (A) has an advantage that the coating operation is simple as compared with the coating operation conventionally used for heat-transfer recording sheets for color image.

The recording sheet (A) of the present invention has another advantage that a clear transferred image can be obtained because each kind of microcapsules enclosing a different pigment or dye are as small as several to several tens of microns in diameter.

The recording sheet (A) of the present invention has a further advantage that the color of transferred image is stable and difficult to fade because each pigment of dye enclosed in each kind of microcapsules has high resistance to light.

In conventional microcapsules, liquids or solids are contained in microcapsules so as to be separated from other substances under ordinary conditions and, when necessary, the microcapsules are destroyed by an impact applied from outside to take out the contents in the microcapsules and to react or mix with other substance(s). Therefore, when the support on which the microcapsules are coated is pressurized, it is envitable that all the microcapsules on the portion of the support pressurized are destroyed without fail and the contents in these microcapsules ooze out.

However, ordinarily used microcapsules such as microcapsules enclosing colorless dyes for pressure-sensitive copying sheets, microcapsules enclosing perfumes and microcapsules enclosing a liquid crystal generally use a wall material consisting of a thermosetting resin; therefore, these microcapsules characteristically are weak to a pressure applied from outside but strong to heat applied from outside.

The photocurable microcapsules used in the recording sheet (A) of the present invention contain a photocurable resin inside and use a heat-meltable substance as the wall material. Owing to this combination, image transfer by heat can be controlled by a light. That is, when it is desired to take out microcapsule contents, a heat is applied by a thermal heat or a heated roll, whereby the wall material of the microcapsules is melted and simultaneously the microcapsule contents in liquid state are transferred onto a plain paper. When it is desired to leave the microcapsule contents on the support of the recording sheet (A), a light is applied to the microcapsules, whereby the light which has passed through the wall material of the microcapsules cures the photocurable resin which is one of the substances contained in the microcapsules and as a result the microcapsule contents are converted from the original liquid state to a hard solid state; consequently, the microcapsules become rigid and, even if a heat is applied from outside, neither microcapsules transfer onto a plain paper nor oozing out of the microcapsule content takes place any longer. The wall material of the microcapsules is a heat-meltable substance and accordingly is melted by heat; however, its transfer onto a plain paper does not take place because the weight ratio of the wall material in the total microcapsules weight is small.

Next, the recording method using the photosensitive heat-transfer recording sheet (A) of the present invention will be explained. A recording sheet (A) and a manuscript are superimposed. When the support of the manuscript is made from a material capable of easily transmitting a light, particularly ultraviolet rays, they are superimposed so that the coated side of the recording sheet (A) and the side of the manuscript having an image, namely, the front side, face each other, and a light is applied from the manuscript side. When the support of the manuscript is made from a material which is difficult to transmit a light (e.g. a book), superimposition is conducted so that the coated side of a recording sheet (A) using a transparent or substantially transparent support and the image side of the manuscript face each other, and a light is applied from the recording sheet side. Light exposure can also be conducted by applying a light to the manuscript and applying the reflection light from the manuscript, to the recording sheet (A). As the light, ultraviolet rays are generally used. As the light source, there can be used sunlight, a xenon light, a low or high pressure mercury lamp, a fluorescent lamp, etc. The recording sheet (A) causes no reduction of characteristics even if the sheet is encounter with indoor light or indirect sunlight during its production and ordinary handling. The light exposure time desirably is adjusted depending upon the combination of the recording sheet (A) and the manuscript. When a light is applied, the image portion(the pattern and/or letter portion) of the manuscript absorbs the light and consequently the portion of the recording sheet (A) corresponding to the image portion receives no light. The other portion of the recording sheet (A) receives the light and accordingly the contents in the microcapsules present in this portion are cured. After the light exposure, the recording sheet (A) and a plain paper are superimposed and a heat is applied from the non-coated side of the recording sheet (A) using a thermal head, a heated roll or the like, whereby the wall material of the microcapsules percent in the portion of the recording sheet (A) corresponding to the image of the manuscript is melted and the contents in these manuscripts are transferred onto the plain paper and thus the same image as that of the manuscript is transfer-recorded on the plain paper.

As is clear from the above, with the photosensitive heat-transfer recording sheet (A) of the present invention, an ordinary manuscript of positive type can be used. The manuscript can be hand written document or a printed matter such as book or the like. Further, since only the microcapsules present at the portion of the recording sheet (A) corresponding to the image portion of the manuscript are heat-melted and transferred onto a plain paper to form a transferred image thereon, the portion of the plain paper other than the transferred image portion causes no staining or color change and accordingly the plain paper to which image transfer has been made has very high storage stability.

The recording sheet (A) of the present invention has a major advantage of being able to conduct multi-color transfer recording. It is conducted by using at least three kinds of microcapsules (each kind of microcapsules enclose a different pigment or dye, a photopolymerization initiator and a different photocurable resin having a particular absorption wavelength) and controlling the curing of each kind of microcapsules using a different light having a particular wavelength.

As the light exposure method used in conducting multi-color transfer recording with the recording sheet (A), there can be used, for example, a method wherein a color manuscript is subjected to color separation to prepare three manuscripts of blue, green and red colors, respectively, and light exposure is made through each manuscript and a method wherein a color picture by CRT or the like is decomposed into blue, green and red components and each component is converted into a corresponding ultraviolet rays.

With the photosensitive heat-transfer recording sheet (A) of the present invention, it is also possible to momentarily form a desensitized portion using a light.

Specifically explaining, the portion of the recording sheet (A) not requiring recording is exposed to a light before the use of the recording sheet (A). This cures the photocurable microcapsules present at said portion and, during recording, no image recording is conducted at this portion even if the portion is heated.

The photosensitive heat-transfer recording sheet (A) of the present invention can be used also as a transfer-onto-plain-paper type pressure-sensitive copying sheet enabling transfer of multi-color images of at least three colors. In this case, the coated side of the recording sheet (A) and a plain paper are superimposed and a pressure (e.g. a pen or a typewriter) is applied from the non-coated side of the recording sheet (A), whereby a duplicate image can be obtained. The transferred or duplicate image formed on the plain paper has a very high density.

PHOTOSENSITIVE PRESSURE-SENSITIVE RECORDING SHEET (B)

The recording sheet (B) of the present invention has a first essential requirement that the recording sheet (B) comprises (a) a support and (b) a layer formed thereon and containing at least three kinds of microcapsules.

As the wall material of the microcapsules, there can be used gelatin, gum arabic, a starch, sodium alginate, ethyl cellulose, carboxyethyl cellulose, a polyvinyl alcohol, a polyethylene, a polyamide, a polyester, a polyurethane, a polyethylene-imine, an urea-formaldehyde resin, a melamine-formaldehyde resin, etc. Materials capable of sufficiently transmitting a light, particularly ultraviolet rays are preferred.

The microcapsules used in the recording sheet (B) can be produced in the same method as for the microcapsules used in the recording sheet (A), such as phase separation method, an interfacial polymerization method, an in-situ method, a spray-drying method or the like.

The support used in the recording sheet (B) can be same as that used in the recording sheet (A).

Also, the method of coating the microcapsules on the support can be same as that used in the recording sheet (A).

The recording sheet (B) of the present invention has a second essential requirement that each kind of microcapsules enclose a photocurable resin solution in which a pigment or dye and a photopolymerization initiator are dissolved or dispersed.

The pigments or dyes, the photocurable resins and the photopolymerization initiators all enclosed in the microcapsules can be same as those used in the recording sheet (A), respectively. Therefore, in-depth explanation on these substances is not made.

The microcapsules can further enclose an organic solvent and various additives, as in the case of the recording sheet (A).

The recording sheet (B) of the present invention has a third essential requirement that the pigment or dye is yellow, magenta and cyan and each pigment or dye is enclosed in a different kind of microcapsules. This enables multi-color recording. It is preferred that the photopolymerization initiator enclosed in the microcapsules enclosing an yellow pigment or dye has a λmax of 340 nm and the photopolymerization initiator enclosed in the microcapsules enclosing a magenta pigment or dye has a λmax of 300 nm and the photopolymerization initiator enclosed in the microcapsules enclosing a cyan pigment or dye has a λmax of 250 nm.

The recording sheet (B) of the present invention has a fourth essential requirement that the micro-capsules-containing layer further contains a wax. This wax addition to the microcapsules-containing layer can enhance the density of recorded image. As the wax, there can be mentioned animal waxes such as bees wax, spermaceti, Chinese wax, lanolin and the like; vegetable waxes such as candelilla wax, carnauba wax, Japan wax, rice wax, cane wax and the like; mineral waxes such as montan wax, ozokerite, ceresine, lignite wax and the like; petroleum waxes such as paraffin wax, microcrystalline wax and the like; modified waxes such as a montan wax derivative, a paraffin wax derivative, a microcrystalline wax derivative and the like; hydrogenated waxes such as castor wax, opal wax and the like; synthetic waxes such as a low molecular polyethylene and its derivative, acra wax, distearyl ketone and the like; saturated fatty acid amide type waxes such as caproic acid amide, caprylic acid amide, pelargonic acid amide, capric acid amide, lauric acid amide, tridecylic acid amide, myristic acid amide, stearic acid amide, behenic acid amide, ethylenebisstearic acid amide and the like; and unsaturated fatty acid amide type waxes such as caproleic acid amide, myristoleic acid amide, oleic acid amide, elaidic acid amide, linolic acid amide, eruic acid amide, ricinoleic acid amide, linolenic acid amide and the like. These waxes can be used singly or in combination.

As in the recording sheet (A), the microcapsules-containing layer (the photosensitive pressure-sensitive layer) can furthermore contain, as necessary, a binder, a latex, a capsule-protecting agent, an inorganic pigment, an organic pigment, a dispersing agent, a defoamant, etc.

The photocurable microcapsules used in the recording sheet (B) of the present invention contain photocurable resins inside. Therefore, the destruction of the microcapsules can be controlled by a light. That is, when it is desired to take out microcapsule contents, an impact is applied to the microcapsules as in the case of ordinary microcapsules, whereby the microcapsules are destroyed and the microcapsule contents ooze out. When it is desired to keep the contents inside the microcapsules, a light is applied to the microcapsules, whereby the light which has passed through the wall material of the microcapsules cures the photocurable resins and as a result the microcapsule contents are converted from the original liquid state to a hard solid state; consequently, the microcapsules become rigid and, even if an impact is applied from outside, neither the destruction of the microcapsules nor oozing out of the microcapsule contents takes place any longer.

Next, the recording method using the photosensitive pressure-sensitive recording sheet (B) will be explained. A manuscript is superimposed on a recording sheet (B) having a photosensitive pressure-sensitive layer composed essentially of photocurable microcapsules and a wax. When the support of the manuscript is made from a material capable of easily transmitting a light, particularly ultraviolet rays, they are superimposed so that the coated side of the recording sheet (B) and the side of the manuscript having an image namely, the front side face each other, and a light is applied from the manuscript side. The same light source as in the recording sheet (A) can be used. When the support of the manuscript is made from a material which is difficult to transmit a light (e.g. a book), superimposition is conducted so that the coated side of a recording sheet (B) using a transparent or substantially transparent support and the side of the manuscript having an image face each side, and a light is applied from the recording sheet side. Light exposure can also be conducted by applying a light to the manuscript and applying the reflection light from the manuscript, to the recording sheet (B). The light exposure time desirably is adjusted depending upon the combination of the recording sheet (B) and the manuscript. When a light is applied, the image portion (the pattern and/or letter portion) of the manuscript absorbs the light and consequently the portion of the recording sheet (B) corresponding to the image portion receives no light. The other portion of the recording sheet (B) receives the light and accordingly the contents in the microcapsules present in this portion are cured. After the light exposure, the recording sheet (B) and a plain paper are superimposed and a pressure is applied using a roll or the like, whereby the microcapsules present in the portion of the recording sheet (B) corresponding to the image of the manuscript are destroyed and thus the same image as that of the manuscript is transfer-recorded on the plain paper.

As is clear from the above, with the photosensitive pressure-sensitive recording sheet (B) of the present invention, an ordinary manuscript of positive type can be used. The manuscript can be a hand written document or a printed matter such as a book or the like. Further, since only the microcapsules at the portion of the recording sheet (B) corresponding to the image portion of the manuscript are destroyed to form a transferred image on plain paper, the portion of the plain paper other than the transferred image portion causes no staining or color change and accordingly the plain paper to which image transfer has been made has very high storage stability.

The photosensitive pressure-sensitive recording sheet (B) of the present invention has the following characteristics. For example, when the recording sheet (B) is exposed to a light together with a manuscript and then pressurized together with a plain paper, a clear image is formed at the very portion of the plain paper corresponding to the portion of the recording sheet (B) not exposed to the light and, at the other portion of the plain paper, there occurs neither microcapsules transfer nor staining because the microcapsules present at the portion of the recording sheet (B) exposed to the light become rigid.

This is an advantage and improvement over the conventional problem that, with ordinary microcapsules enclosing a pigment or dye solution, said solution is transferred by pressurization onto the whole surface of a receiving paper and it causes staining.

The recording sheet (B) of the present invention has a major advantage of being able to conduct multi-color transfer recording. It is conducted by using at least three kinds of microcapsules (each kind of microcapsules enclose a different pigment or dye, a photopolymerization initiator and a different photocurable resin having a particular absorption wavelength) and controlling the curing of each kind of microcapsules using a different light having a particular wavelength.

As the light exposure method used in conducting multi-color transfer recording with the recording sheet (B), as in the case of the recording sheet (A), there can be used, for example, a method wherein a color manuscript is subjected to color separation to prepare three manuscripts of blue, green and red colors, respectively, and light exposure is made through each manuscript and a method wherein a color picture by CRT or the like is decomposed into blue, green and red components and each component is converted into corresponding ultraviolet rays and then light exposure is made using the ultraviolet rays.

With photosensitive pressure-sensitive recording sheet (B) of the present invention, it is also possible to momentarily form a desensitized portion using a light.

Specifically explaining, the portion of the recording sheet (B) not requiring recording is exposed to a light before the use of the recording sheet (B). This cures the photocurable microcapsules present at said portion and, during recording, no image recording is conducted at this portion even if the portion is pressurized.

The photosensitive pressure-sensitive recording sheet (B) of the present invention can be used also as a transfer-onto-plain-paper type pressure-sensitive copying sheet enabling transfer of multi-color images of at least three colors. In this case, the coated side of the recording sheet (B) and a plain paper are superimposed and a pressure (e.g. a pen or a typewriter) is applied from the non-coated side of the recording sheet (B), whereby a duplicate image can be obtained. The transferred or duplicate image formed on the plain paper has a very high density.

The present invention will be explained specifically below by way of Examples. In the Examples, parts refer to parts by weight.

EXAMPLE 1 (PHOTOSENSITIVE HEAT-TRANSFER RECORDING SHEET)

(1) Photocurable microcapsules enclosing an yellow pigment 14.4 parts of Permanent Yellow H10G (an yellow pigment) was added to 148.0 parts of an epoxy acrylate type photocurable resin [RIPOXY (brand name) manufactured by Showa Highpolymer Co., Ltd.)] and 27.6 parts of 1-phenyl-1-xylylethane, and they are mixed thoroughly and made into a uniform dispersion. Thereto was added 0.8 part of 2,2-dimethoxy-2-phenylacetophenone (a photopolymerization initiator having the λmax at 340 nm)] IRGACURE 651 (brand name) manufactured by Ciba Geigy] to prepare a contents to be encapsulated. Separately, a polyvinyl alcohol having a polymerization degree of 400 and a saponification degree of 30 to 35 mole percent was dissolved in ethanol to prepare a 10% polyvinyl alcohol solution.

Using a spray-drying pelletizer, the above contents was slowly added to and finely and uniformly dispersed in the 10% polyvinyl alcohol solution and simultaneously the resulting dispersion was subjected to spray-drying, whereby microcapsules using a polyvinyl alcohol as the wall material and enclosing an yellow pigment was obtained.

(2) Photocurable microcapsules enclosing a magenta pigment

Microcapsules enclosing a magenta pigment were prepared in the same manner as in the above (1) except that the yellow pigment used in the above (1) was replaced by a magenta pigment, namely, Permanent Carmine FG and the photopolymerization initiator having a λmax at 340 nm used in the above (1) was replaced by a photopolymerization initiator having a λmax at 300 nm.

(3) Photocurable microcapsules enclosing a cyan pigment

Microcapsules enclosing a cyan pigment were prepared in the same manner as in the above (1) except that the yellow pigment used in the above (1) was replaced by Phthalocyanine Blue and the photopolymerization initiator having a λmax at 340 nm used in the above (1) was replaced by a photopolymerization initiator having a max at 250 nm.

(4) A coating color having the following formulation was prepared and it was coated on a corona-treated PET film having a thickness of 9 λm using a Meyer bar.

| Photocurable microcapsules enclosing an yellow pigment | 10 parts |
| Photocurable microcapsules enclosing a magenta pigment | 10 parts |
| Photocurable microcapsules enclosing a cyan pigment | 10 parts |
| Polyester resin emulsion | 10 parts |

Using the thus obtained photosensitive heat-transfer recording sheet coated with three kinds of photocurable microcapsules enclosing yellow, magenta and cyan pigments, respectively, transfer recording of a color image was conducted as follows.

Firstly, a color image was subjected to color separation to prepare three color manuscripts having blue, green and red colors, respectively, each consisting of a semi-transparent sheet.

Then, the blue manuscript and the recording sheet were superimposed so that the front side of the former and the coated side of the latter faced each other. Using a color filter, a light of 340 nm was applied to them from the manuscript side. At the portion of the recording sheet corresponding to the non-image portion of the blue manuscript, the photocurable microcapsules enclosing an yellow pigment were cured by the light and became rigid.

Next, using the green manuscript, a light of 300 nm was applied in the same manner. At the portion of the recording sheet corresponding to the non-image portion of the green manuscript, the photocurable microcapsules enclosing a magenta pigment were cured by the light and became rigid.

Further, using the red manuscript, a light of 250 nm was applied in the same manner. At the portion of the recording sheet corresponding to the non-image portion of the red manuscript, the photocurable microcapsules enclosing a cyan pigment were cured by the light and became rigid.

Thus, all the photocurable microcapsules present at the portions of the recording sheet corresponding to the non-image portions of the blue, green and red manuscripts were made rigid. Meanwhile, the photocurable microcapsules present at the portions of the recording sheet corresponding to the image portions of the three manuscripts remained unchanged and kept image transferability by heat. After the three times light exposure, the recording sheet was superimposed on a plain paper. They were subjected to solid printing using a facsimile tester (manufactured by Matsushita Electronic Components Co., Ltd.) at a pulse width of 1.4 msec, whereby a transferred color image same as the original color image could be obtained on the plain paper. The transferred color image had excellent resistance to light because each of the yellow, magenta and cyan pigments used had high resistance to light.

EXAMPLE 2 (PHOTOSENSITIVE PRESSURE-SENSITIVE RECORDING SHEET)

(1) Photocurable microcapsules enclosing an yellow pigment 100 parts of an aqueous solution containing 10% of an ethylene-maleic anhydride copolymer, 10 parts of urea, 1 part of resorcin and 200 parts of water were mixed and made into an aqueous solution. This aqueous solution was adjusted to a pH of 3.5 using an aqueous sodium hydroxide.

14.4 parts of Permanent Yellow H10G was thoroughly dispersed in 165.6 parts of an epoxy acrylate type photocurable resin [RIPOXY (brand name) manufactured by Showa Highpolymer Co., Ltd.]. Thereto was added 0.8 part of 2,2-dimethoxy-2-phenylacetophenone [IRGACURE 651 (brand name) manufactured by Ciba Geigy] (a photopolymerization initiator having a λmax at 340 nm). The resulting mixture was dispersed in the above prepared aqueous solution to obtain an oil-in-water type emulsion having an oil droplet diameter of 4 to 8 microns. To this emulsion was added 2.5 parts of a 37% aqueous formaldehyde solution, and stirring was conducted for 4 hours at 55° C. Then, the solution was cooled to room temperature and thus the preparation of the captioned microcapsules was complated.

(2) Photocurable microcapsules enclosing a magenta pigment

Microcapsules enclosing a magenta pigment were prepared in the same manner as in the above (1) except that the yellow pigment used in the above (1) was replaced by a magenta pigment, namely, Permanent Carmine FB and the photopolymerization initiator having a λmax at 340 nm was replaced by a photopolymerization inhibitor having a λmax at 300 nm.

(3) Photocurable microcapsules enclosing a cyan pigment

Microcapsules enclosing a cyan pigment were prepared in the same manner as in the above (1) except that the yellow pigment used in the above (1) was replaced by a cyan pigment, namely, Phthalocyanine Blue and the photopolymerization initiator having a λmax at 340 nm was replaced by a photopolymerization initiator having a λmax at 250 nm.

(4) A coating color having the following formulation was prepared and it was coated on a base sheet of 50 g/m² using a Meyer bar.

| | |
|---|---|
| Photocurable microcapsules enclosing an yellow pigment | 10 parts |
| Photocurable microcapsules enclosing a magenta pigment | 10 parts |
| Photocurable microcapsules enclosing a cyan pigment | 10 parts |
| Paraffin wax | 10 parts |
| Wheat starch | 20 parts |
| SBR latex | 10 parts |

Using the thus obtained transfer-onto-plain paper type photosensitive pressure-sensitive recording sheet coated with three kinds of photocurable microcapsules enclosing yellow, magenta and cyan pigments, respectively, transfer recording of a color image was conducted as follows.

Firstly, a color image was subjected to color separation to prepare three color manuscripts having blue, green and red colors, respectively, each consisting of a semi-transparent sheet.

Then, the blue manuscript and the recording sheet were superimposed so that the front side of the former and the coated side of the latter faced each other. Using a color filter, a light of 340 nm was applied to them from the manuscript side. At the portion of the recording sheet corresponding to the non-image portion of the blue manuscript, the photocurable microcapsules enclosing an yellow pigment were cured by the light and became rigid.

Next, using the green manuscript, a light of 300 nm was applied in the same manner. At the portion of the recording sheet corresponding to the non-image portion of the green manuscript, the photocurable microcapsules enclosing a magenta pigment were cured by the light and became rigid.

Further, using the red manuscript, light of 250 nm was applied in the same manner. At the portion of the recording sheet corresponding to the non-image portion of the red manuscript, the photocurable microcapsules enclosing a cyan pigment were cured by the light and became rigid.

Thus, the photocurable microcapsules present at the portions of the recording sheet corresponding to the non-image portions of the blue, green and red manuscripts were made rigid. Meanwhile, the photocurable microcapsules present at the portions of the recording sheet corresponding to the image portions of the three manuscripts remained unchanged and kept pressure sensitivity.

After the three times light exposure, the recording sheet was superimposed on a plain paper. They were pressurized by passing between rubber rolls, whereby as transferred color image substantially same as the original color image could be obtained on the plain paper. The transferred color image had excellent resistance to light because each of the yellow, magenta and cyan pigments used had high resistance to light.

What is claimed is:

1. A photosensitive heat-transfer recording sheet capable of producing a print having a high storage stability and suitable for printing on to a plain paper which comprises (a) support and (b) a layer formed thereon and containing at least three kinds of microcapsules, the wall material of which consists of a heat-meltable substance, the microcapsules enclosing a photocurable resin solution in which a pigment or dye and a photopolymerization initiator are dissolved or dispersed, wherein the pigment or dye is yellow, magenta and cyan and each pigment or dye is enclosed in a different kind of microcapsules, and the photopolymerization initiator enclosed in the microcapsules enclosing a yellow pigment or dye has a λmax of 340 nm and the photopolymerization initiator enclosed in the microcapsules enclosing a magenta pigment or dye has a λmax of 300 nm and the photopolymerization initiator enclosed in the microcapsules enclosing a cyan pigment or dye has a λmax of 250 nm.

2. A photosensitive heat-transfer recording sheet according to claim 1, wherein the microcapsules further enclose an organic solvent.

3. A photosensitive heat-transfer recording sheet according to claim 2, wherein the pigment or dye is yellow, magenta and cyan and each pigment or dye is enclosed in a different kind of microcapsules.

4. A photosensitive heat-transfer recording sheet according to claim 1, wherein the heat-meltable substance is a polyvinyl alcohol.

5. A photosensitive heat-transfer recording sheet according to claim 1, wherein the photocurable resin is an epoxy acrylate type resin.

6. A heat-transfer recording method which comprises:

(i) preparing three kinds of microcapsules, the wall material of which is a heat-meltable substance, the first microcapsules enclosing a photocurable resin solution in which an yellow pigment or dye and a photopolymerization initiator having a λmax of 340 nm are dissolved or dispersed, the second microcapsules enclosing a photocurable resin solution in which a magenta pigment or dye and a photopolymerization initiator having a λmax of 300 nm are dissolved or dispersed, and the third microcapsules enclosing a photocurable resin in which a cyan pigment or dye and a photopolymerization initiator having a λmax of 250 nm are dissolved or dispersed;

(ii) applying a coating color containing the three kinds of microcapsules to a support to prepare a photosensitive heat-transfer recording sheet;

(iii) separately, subjecting a full-color manuscript to color separation to prepare three different manuscripts having blue, green and red colors, respectively, and each made of a semi-transparent sheet;

(iv) confronting the front side of the blue manuscript with the coated side of the recording sheet and applying a light having a wave length of 340 nm from the blue manuscript side;

(v) replacing the blue manuscript with the green manuscript and applying a light of a wave length of 300 nm from the green manuscript side;

(vi) replacing the green manuscript with the red manuscript and applying a light of a wave length of 250 nm from the red manuscript side; and (vii) confronting the recording sheet with a receiving sheet and applying a heat to them to conduct heat-transfer recording.

7. A phpotosensitive pressure-sensitive recording sheet comprising (a) support and (b) a layer formed thereon and containing at least three kinds of microcapsules, each kind of microcapsules enclosing a photocurable resin solution in which a pigment or dye and a photopolymerization initiator are dissolved or dispersed, the pigment or dye being yellow, magenta and cyan and each pigment or dye being enclosed in a different kind of microcapsule, and the microcapsule-containing layer further containing a wax, and wherein the photopolymerization initiator enclosed in the microcapsules enclosing a yellow pigment or dye has a λmax of 340 nm and the photopolymerization initiator enclosed in the microcapsules enclosing a magenta pigment or dye has a λmax of 300 nm and the photopolymerization initiator enclosed in the microcapsules enclosing a cyan pigment or dye has a λmax of 250 nm.

8. A photosensitive pressure-sensitive recording sheet according to claim 7, wherein the microcapsules further enclose an organic solvent.

9. A photosensitive pressure-sensitive recording sheet according to claim 7, wherein the photocurable resin is an epoxy acrylate type resin.

10. A pressure-sensitive recording method which comprises:
(i) preparing three kinds of microcapsules, the first microcapsules enclosing a photocurable resin solution in which an yellow pigment or dye and a photopolymerization initiator having a λmax of 340 nm are dissolved or dispersed, the second microcapsules enclosing a photocurable resin solution in which a magenta pigment or dye and a photopolymerization initiator having a λmax of 300 nm are dissolved or dispersed, and the third microcapsules enclosing a photocurable resin in which a cyan pigment or dye and a photopolymerization initiator having a λmax of 250 nm are dissolved or dispersed;
(ii) applying a coating color containing the three kinds of microcapsules to a support to prepare a photosensitive pressure-sensitive recording sheet;
(iii) separately, subjecting a full-color manuscript to color separation to prepare three different manuscripts having blue, green and red colors, respectively, and each made of a semi-transparent sheet;
(iv) confronting the front side of the blue manuscript with the coated side of the recording sheet and applying a light having a wave length of 340 nm from the blue manuscript side;
(v) replacing the blue manuscript with the green manuscript and applying a light of a wave length of 300 nm from the green manuscript side;
(vi) replacing the green manuscript with the red manuscript and applying a light of a wave length of 250 nm from the red manuscript side; and
(vii) confronting the recording sheet with a receiving sheet and applying a pressure to them to conduct pressure-sensitive recording.

11. The photosensitive heat-transfer recording sheet according to claim 1 wherein the heat-meltable substance is a wax.

* * * * *